United States Patent [19]

Nagasaka et al.

[11] Patent Number: 5,084,323
[45] Date of Patent: Jan. 28, 1992

[54] CERAMIC MULTI-LAYER WIRING SUBSTRATE AND PROCESS FOR PREPARATION THEREOF

[75] Inventors: Takahashi Nagasaka, Anjo; Tadahiko Morimoto, Komaki; Michio Asai, Nagoya, all of Japan

[73] Assignees: Nippondenso Co., Ltd., Kariya; NGK Insulators, Ltd., Nagoya, both of Japan

[21] Appl. No.: 509,244

[22] Filed: Apr. 6, 1990

[30] Foreign Application Priority Data

Apr. 7, 1989 [JP] Japan ............................ 1-86942

[51] Int. Cl.$^5$ .............................................. B32B 3/00
[52] U.S. Cl. ................................. 428/137; 428/209; 428/426; 428/433; 428/457; 428/901; 427/96; 361/397; 361/414; 156/89
[58] Field of Search ............... 29/830; 2/846; 156/89; 427/96; 428/137, 209, 426, 433, 457, 901; 361/397, 414

[56] References Cited

U.S. PATENT DOCUMENTS

| 4,493,789 | 1/1985 | Veyama et al. | 524/439 |
| 4,604,496 | 8/1986 | Ishihara et al. | 361/414 |
| 4,791,239 | 12/1988 | Shirahata et al. | 361/414 |
| 4,870,746 | 10/1989 | Klaser | 29/830 |
| 4,893,404 | 1/1990 | Shirahata et al. | 29/846 |

FOREIGN PATENT DOCUMENTS

| 6253960 | 8/1984 | Japan . |
| 63-17357 | 4/1988 | Japan . |
| 63-18356 | 4/1988 | Japan . |
| 1228903 | 4/1971 | United Kingdom . |

Primary Examiner—Patrick J. Ryan
Attorney, Agent, or Firm—Cushman, Darby & Cushman

[57] ABSTRACT

Disclosed is a ceramic multi-layer wiring board comprising a multi-layer wiring board having a plurality of insulating layers and a plurality of refractory metal layers, which are alternately formed, the end portion of the outermost insulating layer among the insulating layers being covered with the outermost refractory metal layer among the refractory metal layers, an oxidation-resistant barrier layer formed on the outermost refractory metal layer, and a thick film conductor formed on the outermost insulating layer and the oxidation-resistant barrier layer. In this structure, since the end portion of the outermost insulating layer is covered with the oxidation-resistant barrier layer, defects do not appear in the end portion and the inner conductor layers are not oxidized even in a high-temperature oxidizing atmosphere.

22 Claims, 4 Drawing Sheets

CERAMIC MULTI-LAYER WIRING SUBSTRATE AND PROCESS FOR PREPARATION THEREOF

BACKGROUND OF THE INVENTION

1. Field of the Invention

The present invention relates to a ceramic multi-layer wiring board, and a process for the preparation thereof. More particularly, the present invention relates to an improved ceramic multi-layer wiring board, and a process for the preparation thereof, whereby a stable electroconductivity is maintained.

2. Description of the Related Art

The conventional ceramic multi-layer wiring board is roughly divided into a printed multi-layer board and a laminated multi-layer board, and the conventional ceramic multi-layer wiring board is prepared according the process described below.

This preparation process will be described with reference to the printed multi-layer board as an example. First, an insulating paste for forming an insulating layer and a conductor paste for forming a refractory metal conductor layer are alternately printed on a ceramic green sheet to form a plurality of insulating layers and a plurality of conductor layers, and these layers are simultaneously fired in a reducing atmosphere to obtain a multi-layer wiring board having an exposed conductor layer. Thereafter, a conductor paste for mounting parts and forming thick film elements is printed on the exposed conductor layer of the multi-layer wiring board, and the conductor paste is fired in an oxidizing atmosphere to obtain a ceramic multi-layer wiring board.

More specifically, we shown in FIG. 4 illustrating an example of the multi-layer wiring board having an exposed conductor layer, which is obtained by forming a multi-layer wiring portion by the printing method and carrying out the simultaneous firing in a reducing atmosphere, a wiring pattern Ml is formed on a green sheet or a green sheet 1 having a multi-layer wiring installed therein by using a conductor paste for forming a conductor layer, and then an insulating paste Z1 is printed thereon to form an insulating layer. Thereafter, a via hole-embedding pattern M2 is printed by a conductor paste for forming via holes, composed of a refractory metal, an insulating paste Z2, a conductor paste M3, and an insulating paste Z3 are printed in sequence, and then firing is conducted in a reducing atmosphere to prevent oxidation of the conductor paste. Then, for example, a nickel plating 2 and an oxidation-resistant barrier comprising an Au/Ag alloy layer 3 are formed on the surface of the conductor layer M3, except for the surface of the portion of the insulating layer Z3, to prevent oxidation of the inner conductor, and then, a conductor paste for mounting parts and forming thick film elements is printed. The conductor paste is fired in an oxidizing atmosphere to obtain an intended ceramic multi-layer wiring board.

The insulating paste and the conductor paste are alternately printed because for example, if a plurality of layers are continuously formed by printing the insulating paste, the level difference become accordingly larger, and when the conductor paste is then printed, an unsatisfactory insulation or a formation of printing faults occurs.

In the above-mentioned conventional ceramic multi-layer wiring board, as shown in an enlarged sectional partial view of FIG. 5, among the simultaneously fired insulating layers of the multi-layer wiring board, the end portion T of the outermost insulting layer Z3 becomes thin because of a sagging and bleeding of the printed insulating paste. The thickness $t_0$ of the insulating layer Z3 is 10 to 20 $\mu$m, but sometimes the thickness $t_1$ of the end portion T is about 1 to about 2 $\mu$m. In this state, since pinholes are formed or the number of ceramic particles is reduced in this end portion T, the possibility of a formation of defects through the spaces among the ceramic particles in this insulating layer is very high. Moreover, the inventors, found that, since the oxidation-resistant barrier layer composed of the nickel plating 2 and the Au/Ag alloy 3 is not formed on this portion, the problem of oxidation of the end portion of the inner conductor layer M3 arises during the firing conducted in a high-temperature oxidizing atmosphere. This oxidation cause various problems to arise, such as a disconnection of the conductor pattern and lowering of the electroconductivity, and further, the problem of a reduction of the manufacturing yield arises.

SUMMARY OF THE INVENTION

The present invention was created as a result of the finding of the above-mentioned problems in the conventional technique, and an object of the present invention is to provide a ceramic multi-layer wiring board by which the above-mentioned problems are solved, no defects appear in the insulating layers, and a stable electroconductivity is maintained, and a process for the preparation thereof.

In accordance with the present invention, this object can be attained by a ceramic multi-layer wiring board comprising a multi-layer wiring board having a plurality of insulating layers and a plurality of refractory metal conductor layers formed alternately, the multi-layer wiring board having an outermost insulating layer and an outermost refractory metal conductor layer below the outermost insulating layer, the outermost insulating layer having a defined opening, an extension of the outermost refractory metal conductor layer being formed within the opening and the end portion, defining the opening, of the outermost insulating layer covered with the end portion of the extension of the outermost refractory conductor layer; an oxidation-resistant barrier layer formed on said extension of the outermost refractory metal conductor layer; and a thick film conductor formed on the outermost insulating layer and the oxidation-resistant barrier layer.

Furthermore, in accordance with the present invention, there is provided a process for the preparation of a ceramic multi-layer wiring board, which comprises the step of alternately forming a plurality of insulating materials for forming a plurality of insulating layers and a plurality of conductor pastes for forming a plurality of refractory metal conductor layers, wherein, after printing an outermost insulating material of a plurality of the insulating materials by an insulating past, the outermost conductor paste of a plurality of the conductor pastes is formed on an opening defined by the outermost insulating past; the step of simultaneously firing a plurality of the insulating materials and a plurality of the conductor pastes in a reducing atmosphere to form a multi-layer wiring board; the step of forming an oxidation-resistant barrier layer on the outermost refractory metal conductor layer of the multi-layer wiring board; and the step of printing a conductor paste for the formation of a thick film element on the outermost insulating layer on the multi-layer wiring board and the oxidation-resistant barrier layer and firing the conductor paste in an oxidizing atmosphere to form a thick film conductor.

According to the present invention, since the end portion of the outermost insulating layer defining the outermost refractory metal conductor layer can be covered with the oxidation-resistant barrier layer, a formation of defects in the end portion of the insulating layer can be prevented, and the inner conductor layers are not oxidized even in a high-temperature oxidizing atmosphere.

DESCRIPTION OF THE PREFERRED EMBODIMENTS

Figure 1:
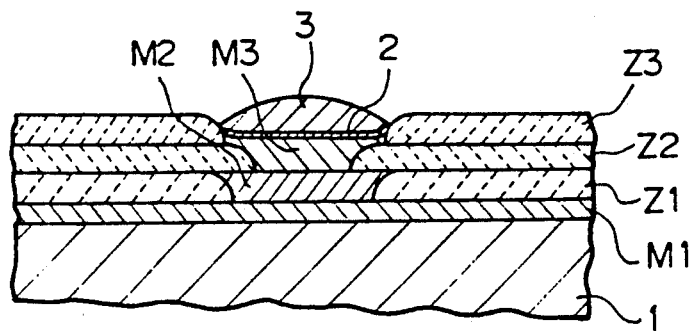
FIG. 1 is a sectional view illustrating the structure of an embodiment of the ceramic multi-layer wiring board of the present invention.

FIG. 1 illustrates the structure of one embodiment of the ceramic multi-layer wiring board of the present invention formed by the printing method. Referring to FIG. 1, insulating pastes Z1, Z2 and Z3 of $Al_2O_3$, AlN or mullite for forming insulating layers, and readily oxidizable conductor pastes M1, M2 and M3 of Mo, W or the like for forming refractory metal conductor layers, and alternately printed on a ceramic green sheet or a green sheet 1 having a multi-layer wiring installed therein, and the thus-formed layers are simultaneously fired together with the green sheet 1 in a reducing atmosphere to obtain a multi-layer wiring board having an exposed conductor layer composed of a refractory metal.

The multi-layer wiring board having the structure shown in FIG. 1 can be obtained by printing the conductor paste M1, insulating paste Z1, conductor paste M2, insulating paste Z2, and insulating paste Z3 in sequence on the green sheet 1, and finally, printing the conductor paste M3. More specifically, although in the conventional technique shown in FIG. 4 the conductor paste M3 is preformed when the insulating paste Z3 for forming the outermost layer of the multi-layer wiring board formed by the simultaneous firing and the insulating paste Z3 are formed, according to the present invention, this order is reversed and the insulating paste Z3 is preformed. This is one characteristic feature of the present invention, and this feature allows the production of a structure in which the end portion of the formed insulating layer Z3 is completely covered with the refractory metal layer M3 as the outermost layer.

Subsequently, in this state, a plating layer such as a nickel (Ni) plating layer 2 is formed on the exposed conductor layer M3, and then sintering is carried out. Furthermore, a thick film paste comprising, for example, Au and Ag as the metal components, is printed as the Au-Ag alloy on the nickel plating 2, and the alloy is melted at a temperature higher than the melting point thereof in a nitrogen or hydrogen atmosphere to form an Au-Ag alloy layer 3 as the oxidation-resistant barrier layer. Note, 5 to 15% of glass is contained in this Au-Ag alloy layer 3, and the alloy layer can be formed on another noble metal.

Figure 6:
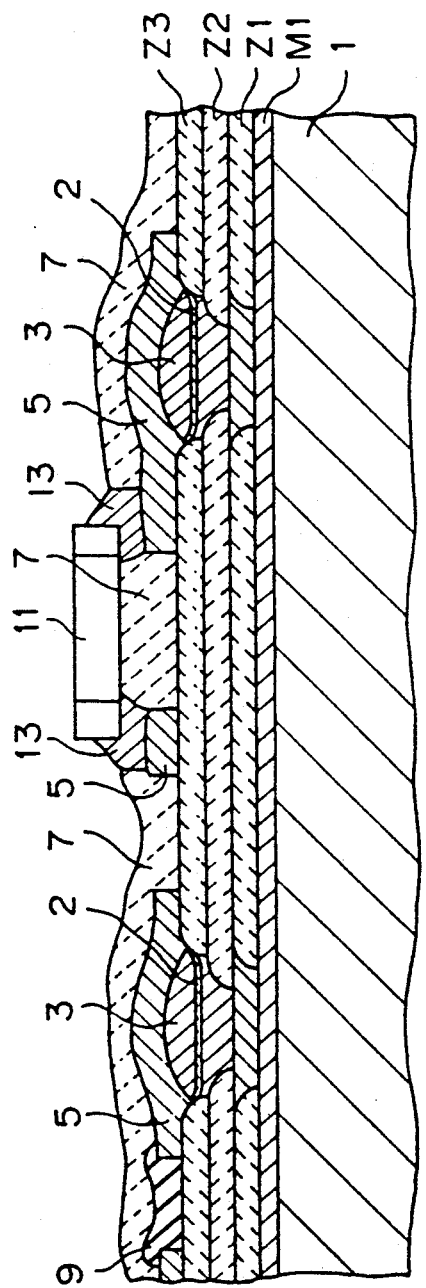
FIG. 6 is a sectional view illustrating the structure of the embodiment shown in FIG. 1, to the last step.

Then, as shown in FIG. 6, a conductor paste of Ag-Pd or Ag for mounting parts and forming thick film elements is printed selectively on the Au-Ag alloy layer 3 and insulating layer Z3, and the paste is fired in an oxidizing atmosphere to form a thick film conductor 5. To improve the reliability thereof, a thick film-bonding conductor layer can be formed between the Au-Ag alloy layer 3 and the thick film conductor 5, and then a resistor paste composed of a material having a pyrochlore structure, such as ruthenium oxide or ruthenium, is printed on necessary parts and fired to form a resistor 9, and a protecting glass 7 composed of a low-melting-point glass having a melting point of a temperature ranging from 300° to 700° C., for example, about 460° C. is formed selectively thereon. A part such as a chip capacitor 11 is bonded to the opening of the protecting glass by a solder 13.

According to the present embodiment, as described above, the end portion of the outermost insulating layer Z3 is covered with the outermost refractory metal layer M3, and the portion of the insulating layer Z3 not covered with the refractory metal layer M3 has a relatively large thickness, and therefore, an undesirable oxidation of the refractory metal layer located below the insulating layer Z3, due to defects of the insulating layer Z3, at the step of firing the thick film-forming paste in an oxidizing atmosphere does not occur.

Note, since the nickel plating 2 and the oxidation-resistant barrier layer comprising the Au-Ag alloy are present on the refractory metal layer M3, oxidation of the interior is prevented. Furthermore, since the bonding surfaces of the Au-Ag alloy layer 3 and insulating layer Z3 are closely sealed with the frit component, such as glass, contained in the Au-Ag alloy layer 3, an intrusion of oxygen is prevented.

Figure 3:
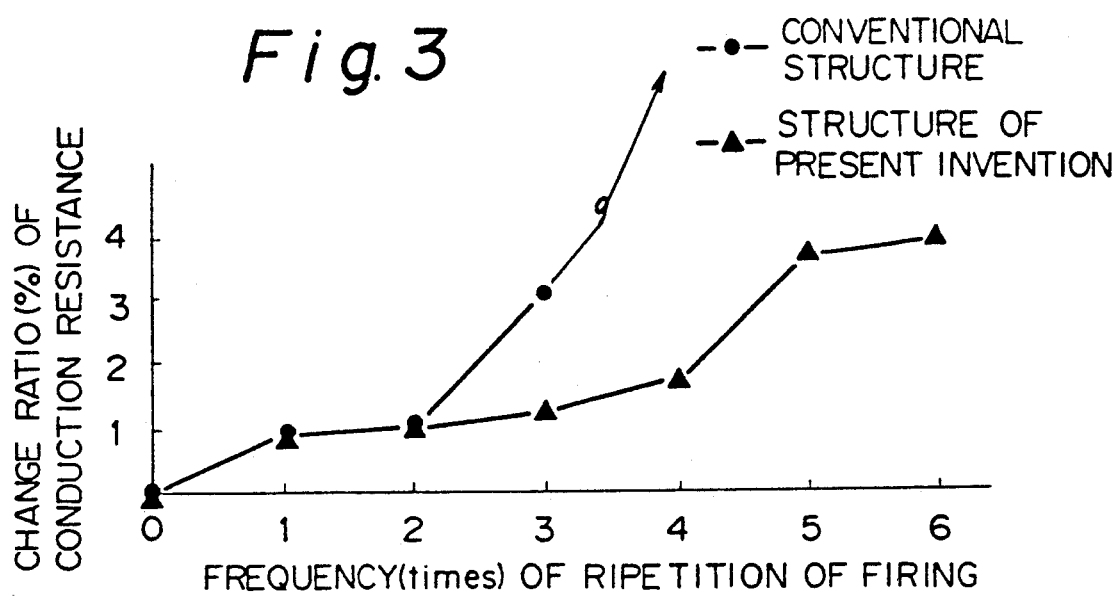
FIG. 3 is a graph illustrating the relationship between the average value of the change ratio of the electric resistivity of the via structure and the number of times of repetition of the firing operation.
Figure 4:
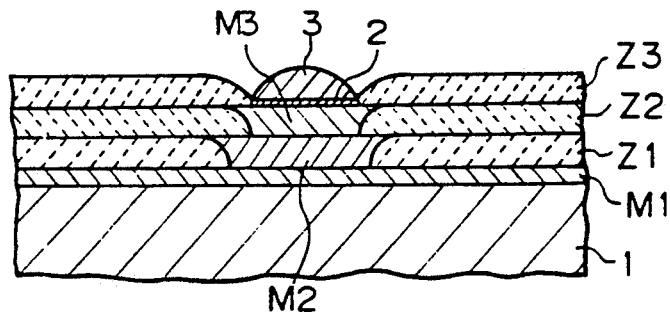
FIG. 4 is a sectional view illustrating the structure of an example of the conventional ceramic multi-layer wiring board.
Figure 5:
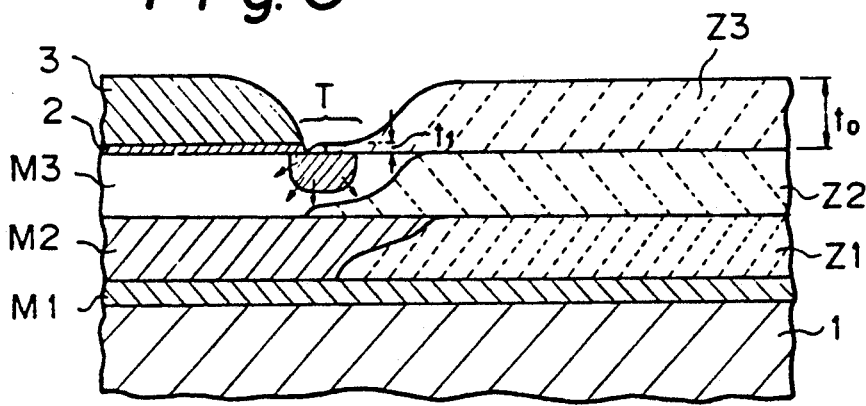
FIG. 5 is a sectional view illustrating the problems of the conventional ceramic multi-layer wiring board.

One thousand oxidation-resistant via portions having the structure of the present embodiment and one thousand via portions shown in FIG. 4 are repeatedly fired at 850° C. in an oxidizing atmosphere for 10 minutes at each firing, for 60 minutes as a whole, and with respect to each via portion sample, the change ratio of the resistivity to the initial value is measured. The relationship between the value of the electric resistivity of each via portion sample and the number of times of the repetition of the firing is shown in FIG. 3.

From the results shown in FIG. 3 it can be seen that, in the case of the oxidation-resistant via portion of the present invention, the resistivity of the conductor is not substantially changed even if the firing is repeated 6 times, and in contrast, in the case of the conventional via structure, the via portion sample is oxidized at the fourth firing, the resistivity of the conduction in the interior of the via is increased, and finally, a disconnection occurs.

Another characteristic feature of the present embodiment will now be described.

The size of the opening of the insulating paste Z3 defining the refractory metal layer M3 is larger than the size of the opening of the insulating paste Z2.

Figure 7:
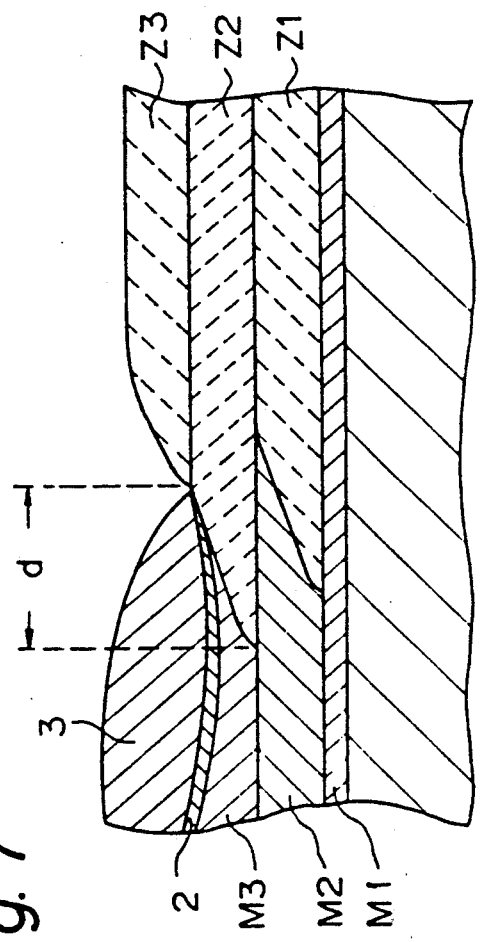
FIG. 7 and FIGS. 8A and 8B are sectional views illustrating the effects of the embodiment shown in FIG. 1.

Due to this characteristic feature, even if a defect is formed in the insulating layer Z3 not covered with the refractory metal layer M3 at the step of firing the conductor paste for mounting parts and forming thick film elements, since the insulating layer Z2 having a required thickness exists below the insulating layer Z3, the refractory metal layer is not oxidized and the reliability is further improved. Furthermore, even if, as shown in FIG. 7, a printing disalignment occurs when printing the conductor paste M3, and the conductor paste M3 is not formed on the insulating paste Z3, since the insulating paste Z2 is discrepantly arranged below the insulating paste Z3, the oxidation of the refractory layer can be prevented. Accordingly, if this structure is adopted, the disalignment during printing can be accepted by the discrepancy d between the insulating pastes Z2 and Z3.

Figure 8A:
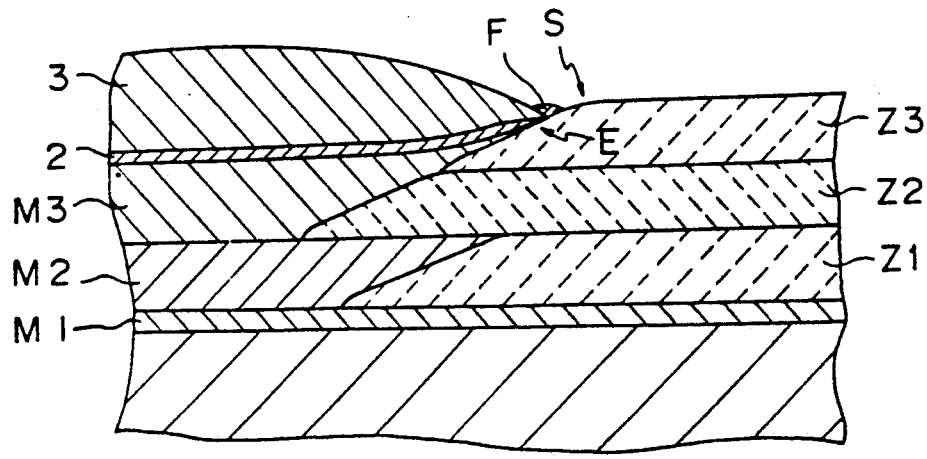
Figure 8B:
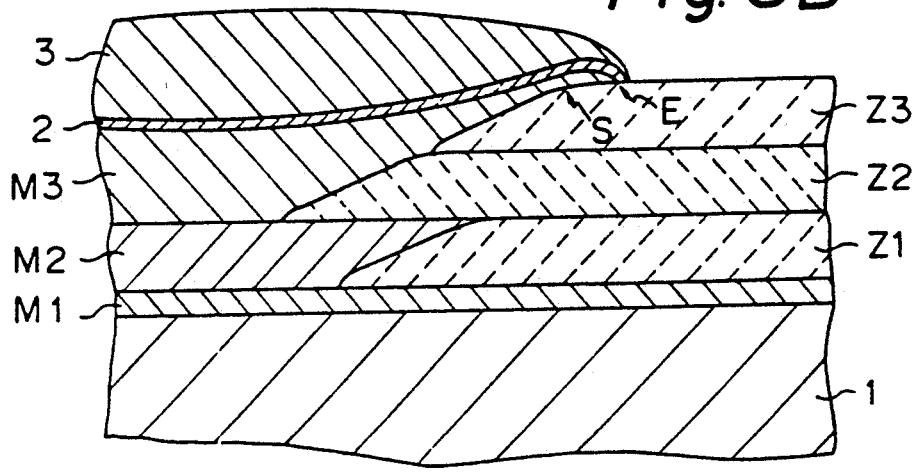

Furthermore, in the present embodiment, as shown in FIG. 8A, the assembly is arranged so that the end portion E of the refractory metal layer M3 is located on the inner side of the via to the shoulder S of the opening of the insulating layer Z3. The effect attained by this arrangement will now be described. At the time of the melting of the Au-Ag alloy layer 3, as pointed out hereinbefore, the frit component such as glass is dissolved out to the periphery of the metal component and adheres closely to the bonding surfaces of the Au-Ag alloy layer 3 and insulating layer Z3, to thereby exert a sealing function, whereby an effect of intercepting an intrusion of oxygen is attained. Nevertheless, the end portion E of the refractory metal layer M3 is arranged on the side outer of the shoulder S of the insulating layer Z3 as shown in FIG. 8B, the dissolved out frit component is dispersed on the insulating layer Z3, and thus the above effect cannot be obtained. In contrast, if the arrangement shown in FIG. 8A is adopted, a dent is formed between the Au-Ag alloy layer 3 and the insulating layer Z3, and the precipitated frit component F readily collects in this dent to exert the above-mentioned effect. Note, the above-mentioned shoulder S is the starting point from which the reduction of the thickness of the insulating layer Z3 by sagging begins.

Figure 2:
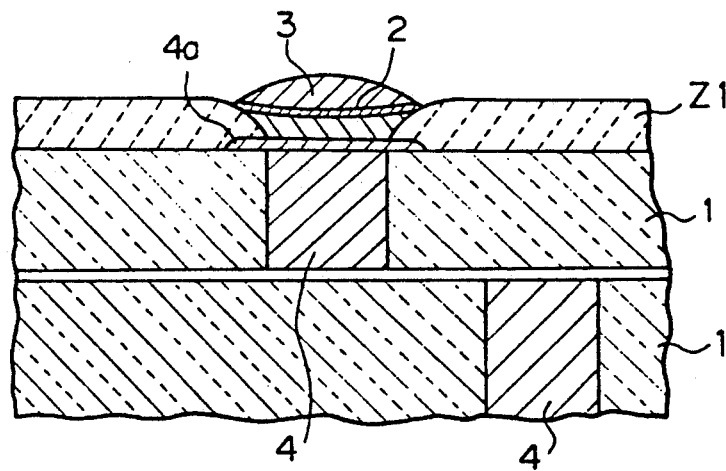
FIG. 2 is a sectional view illustration an example wherein the ceramic multi-layer wiring board of the present invention is formed according to the lamination process.

FIG. 2 is a diagram illustrating the structure of another embodiment of the ceramic multi-layer wiring board of the present inventioned formed by the lamination method. Referring to FIG. 2, a multi-layer wiring board having an exposed conductor layer is obtained by printing an insulating paste Z1 for forming an insulating layer and a via hole-forming conductor paste M3 comprising a refractory metal on a multi-layer wiring green sheet 1 formed by laminating a plurality of sheets on which a conductor layer-forming conductor paste comprising a refractory metal is printed, and simultaneously, firing these pastes in a reducing atmosphere. In FIG. 2, reference numeral 4a represents a land formed of the same conductor as the conductor in the through hole 4 to, accept the discrepancy of the position.

This embodiment is structurally different from the conventional technique in that the end portion of the printed insulating layer Z1 defining the exposed conductor layer comprising the through hole 4 is completely covered with the refractory metal layer M3 constituting the exposed conductor layer. For example, a nickel plating 2 and an oxidation-resistant barrier layer comprising an Au-Ag alloy layer 3 are formed on the opening of the refractory metal layer M3, and therefore, even if a paste for mounting parts and forming thick film elements is printed and fired in an oxidizing atmosphere, the interior refractory metal conductor is not oxidized because the refractory metal layer M3 is present on the end portion of the outermost insulating layer Z1 where defects readily appear and the nickel plating 2 and the oxidation-resistant barrier layer comprising the Au-Ag alloy layer are also present.

The multi-layer wiring board of the present invention having the structure shown in FIG. 2 can be obtained by printing an insulating paste Z1 and a conductor paste M3 in this order on a green sheet 1.

The present invention has been illustrated with reference to the foregoing embodiments, but various modifications, for example, the modifications described below, can be made without departing from the scope of the present invention.

(1) By using any of green sheet portions formed by the above-mentioned printing method and lamination method and a combination of these methods, the multi-layer wiring board of the present invention having a structure comprising an exposed conductor layer can be obtained, and the intended effect can be similarly attained.

Figure 9:
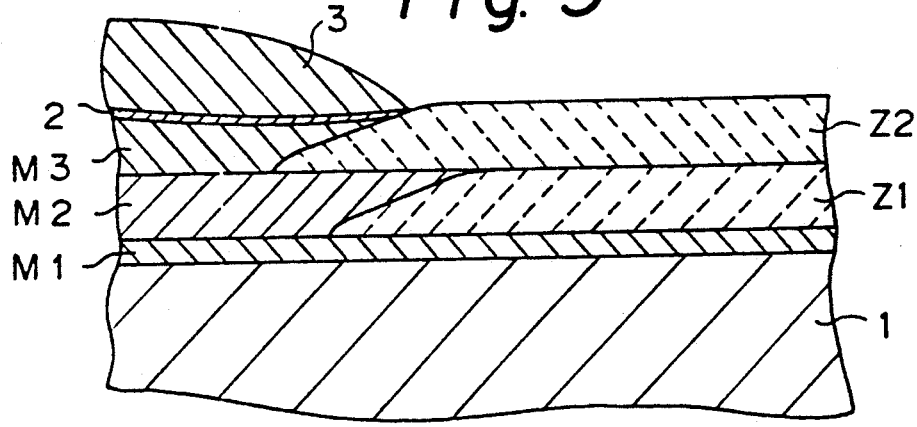
FIG. 9 is a sectional view showing another example of the embodiment shown in FIG. 1.

(2) In the embodiment shown in FIG. 1, the insulating paste Z2 is printed and insulating paste Z3 is then printed, and subsequently, the conductor paste M3 is printed, but a modification can be adopted in which, as shown in FIG. 9, after the insulating paste Z2 is printed, the conductor paste M3 is printed without printing the insulating paste Z3. Even if this modification is adopted, the end portion of the insulating paste Z2 is covered with the conductor paste M3, and the intended effect can be similarly attained.

(3) In the embodiment shown in FIG. 2, after the insulating paste Z1 is printed, the conductor paste M3 is printed, but a modification can be adopted in which after the insulating paste is lap-printed, the conductor paste M3 is printed as in the embodiment shown in FIG. 1.

(4) As the plating layer, there can be used a layer of (Ni plating+Au plating), a layer of (Cr plating+Ni plating), a layer of (Cr plating+Ni plating+Au plating), a layer of (Cr plating+Cu plating), a layer of Cu plating and a layer of (Ni plating+Cu plating) as well as the above-mentioned Ni plating layer.

All of the materials of the refractory layers M1, M2 and M3 need not have the same composition, but the outermost refractory metal layer M3 must be formed of an easily oxidizable material.

We claim:

1. A ceramic multi-layer wiring board comprising
a multi-layer wiring board having a plurality of insulating layers and a plurality of refractory metal conductor layers formed alternately, said multi-layer wiring board having an outermost insulating layer and an outermost refractory metal conductor layer below said outermost insulating layer, said outermost insulating layer having a defined opening, an extension of said outermost refractory metal conductor layer being formed within said opening, and the end portion, defining said opening, of the outermost insulating layer being covered with the end portion of said extension of the outermost refractory conductor layer;

an oxidation-resistant barrier layer comprising a noble metal formed on said extension of the outermost refractory metal conductor layer; and a thick film conductor formed on the outermost insulating layer and the oxidation-resistant barrier layer.

2. A ceramic multi-layer wiring board as set forth in claim 1, further comprising a plating layer formed between the outermost refractory metal layer and the oxidation-resistant barrier layer.

3. A ceramic multi-layer wiring board as set forth in claim 2, further comprising a protecting glass composed of a low-melting-point glass having a melting point of 300 to 700° C. formed on the thick film conductor and said outermost layer.

4. A ceramic multi-layer wiring board as set forth in claim 3, further comprising a resistor formed on the outermost insulating layer and electrically connected to the thick film conductor.

5. A ceramic multi-layer wiring board as set forth in claim 1, wherein the outermost refractory metal conductor layer covers the end portions of the outermost insulating layer and the insulating layer below the outermost insulating layer.

6. A ceramic multi-layer wiring board as set forth in claim 5, wherein the size of the opening, defining the refractory metal conductor layer, of the outermost insulating layer is larger than the size of the opening, defining the refractory metal conductor layer, of the insulating layer below the outermost insulating layer.

7. A ceramic multi-layer wiring board as set forth in claim 1, wherein the outermost refractory metal layer covers the end portion of the outermost insulating layer on the side inner than the shoulder of the opening, defining the refractory conductor layer, of the outermost insulating layer.

8. A ceramic multi-layer wiring board as set forth in claim 7, wherein the oxidation-resistant barrier layer contains a glass therein.

9. A process for the preparation of a ceramic multi-layer wiring board, which comprises the steps of
alternately forming a plurality of insulating materials for forming a plurality of insulating layers and a plurality of conductor pastes for forming a plurality of refractory metal conductor layers, where after printing an outermost insulating material among a plurality of the insulating materials by an insulating paste, an outermost conductor paste among a plurality of the conductor pastes is formed on an opening defined by the outermost insulating paste;
simultaneously firing a plurality of the insulating materials and a plurality of the conductor pastes in a reducing atmosphere to form a multi-layer wiring board;
forming an oxidation-resistant barrier layer comprising a noble metal on the outermost refractory metal conductor layer of the multi-layer wiring board; and
printing a conductor paste for formation of a thick film element on the outermost insulating layer of the multi-layer wiring board and the oxidation-resistant barrier layer and firing the conductor paste in an oxidizing atmosphere to form a thick film conductor.

10. A preparation process according to claim 9, wherein at the step of forming a plurality of insulating pastes and a plurality of conductor pastes, the printing is carried out so that the end portion of the outermost insulating paste is covered with the outermost conductor paste.

11. A preparation process according to claim 10, which further comprises the step of forming a plating layer between the outermost refractory metal conductor layer and the oxidation-resistant barrier metal layer.

12. A preparation process according to claim 11, which further comprises the step of forming a protecting glass layer composed of a low-melting-point glass having a melting point of 300° to 700° C. the thick film conductor and said outermost layer.

13. A preparation process according to claim 12, which further comprises the step of forming a resistor electrically connected with the thick film conductor on the outermost insulating layer.

14. A preparation process according to claim 10, wherein the step of forming the outermost insulating layer is conducted so that the opening, defining the refractory metal layer, of the outermost insulating layer is formed so that the size of said opening is larger than the size of the opening, defining the refractory metal layer, of the insulating layer below said outermost insulating layer.

15. A preparation process according to claim 9, wherein the step of forming the outermost refractory-metal conductor layer is conducted so that the outermost refractory metal layer is formed to cover the end portion of the outermost insulating layer on the side inner than the shoulder of the opening, defining the refractory metal layer, of the outermost insulating layer.

16. A preparation process according to claim 15, wherein at the oxidation-resistant barrier layer-forming step, an oxidation-resistant barrier layer containing a glass therein is formed.

17. A ceramic multi-layer wiring board as set forth in claim 1, wherein said noble metal is an Au-Ag alloy.

18. A ceramic multi-layer wiring board as set forth in claim 1, wherein the oxidation-resistant barrier layer contains a frit.

19. A preparation process according to claim 9 wherein said noble metal is an Au-Ag alloy.

20. A preparation process according to claim 9 wherein said oxidation-resistant barrier layer contains a frit.

21. A preparation process according to claim 10 wherein said noble metal is an Au-Ag alloy.

22. A preparation process according to claim 10 wherein said oxidation-resistant barrier layer contains a frit.

* * * * *

UNITED STATES PATENT AND TRADEMARK OFFICE
CERTIFICATE OF CORRECTION

PATENT NO. : 5,084,323

DATED : January 28, 1992

INVENTOR(S) : Takashi NAGASAKA, et al.

It is certified that error appears in the above-identified patent and that said Letters Patent is hereby corrected as shown below:

On the Title Page

[75] Inventors:

The first-listed inventor's name should read --

Takashi Nagasaka

Signed and Sealed this

Nineteenth Day of April, 1994

*Attest:*

BRUCE LEHMAN

*Attesting Officer*  *Commissioner of Patents and Trademarks*